(12) United States Patent
Matsumura et al.

(10) Patent No.: US 7,609,737 B2
(45) Date of Patent: Oct. 27, 2009

(54) NITRIDE SEMICONDUCTOR LASER ELEMENT

(75) Inventors: Hiroaki Matsumura, Anan (JP); Masanao Ochiai, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 10/563,811

(22) PCT Filed: Jul. 9, 2004

(86) PCT No.: PCT/JP2004/009852
§ 371 (c)(1),
(2), (4) Date: Jun. 9, 2006

(87) PCT Pub. No.: WO2005/006506
PCT Pub. Date: Jan. 20, 2005

(65) Prior Publication Data
US 2006/0256825 A1    Nov. 16, 2006

(30) Foreign Application Priority Data
Jul. 10, 2003  (JP) .............................. 2003-273123

(51) Int. Cl.
*H01S 3/04* (2006.01)
(52) U.S. Cl. .............. 372/43.01; 372/44.01; 372/45.01; 372/49.01
(58) Field of Classification Search ........ 372/39–50.32, 372/43.01, 44.01–50.23
See application file for complete search history.

(56) References Cited

U.S. PATENT DOCUMENTS

| | | | |
|---|---|---|---|
| 4,607,368 A | 8/1986 | Hori | |
| 5,247,536 A | 9/1993 | Kinoshita | |
| 6,057,565 A * | 5/2000 | Yoshida et al. | 257/102 |
| 2002/0024981 A1 | 2/2002 | Tojo et al. | |
| 2002/0053676 A1 * | 5/2002 | Kozaki | 257/88 |
| 2002/0141321 A1 * | 10/2002 | Wada et al. | 369/112.18 |
| 2002/0189532 A1 | 12/2002 | Motoki et al. | |
| 2004/0105473 A1 * | 6/2004 | Tojo et al. | 372/45 |
| 2004/0213315 A1 * | 10/2004 | Kume et al. | 372/50 |
| 2005/0042787 A1 | 2/2005 | Ito et al. | |

FOREIGN PATENT DOCUMENTS

EP    0 949 731 A2    10/1999

(Continued)

*Primary Examiner*—Minsun Harvey
*Assistant Examiner*—Xnning Niu
(74) *Attorney, Agent, or Firm*—Birch, Stewart, Kolasch & Birch, LLP

(57) ABSTRACT

A nitride semiconductor laser device comprises a nitride semiconductor substrate (101); a nitride semiconductor lamination structure that has an n-type semiconductor layer (102), an active layer (104) and a p-type semiconductor layer (103) laminated on or above the nitride semiconductor substrate (101), and has a stripe-shaped waveguide region for laser light; and end surface protective films (110) on the both end surfaces substantially perpendicular to the waveguide region. In the nitride semiconductor laser device, the nitride semiconductor substrate (101) has a luminescent radiation region (112) that absorbs light emitted from the active layer (104) and emits luminescent radiation with a wavelength longer than the wavelength of the emitted light, and the end surface protective films (110) have a high reflectivity for the wavelength of the luminescent radiation from the luminescent radiation region (112). Accordingly, a nitride semiconductor laser device that does not improperly operate and has excellent FFP is provided.

17 Claims, 3 Drawing Sheets

FOREIGN PATENT DOCUMENTS

| | | |
|---|---|---|
| JP | 8-191171 A | 7/1996 |
| JP | 11-154770 A | 6/1999 |
| JP | 2000-196199 A | 7/2000 |
| JP | 2002-76518 A | 3/2002 |
| JP | 2002-100830 A | 4/2002 |
| JP | 2002-280663 A | 9/2002 |
| JP | 2002-314198 A | 10/2002 |
| JP | 2002-373864 A | 12/2002 |
| JP | 2003-069156 A | 3/2003 |
| JP | 2003-133649 A | 5/2003 |
| JP | 2003-133650 A | 5/2003 |

* cited by examiner

NITRIDE SEMICONDUCTOR LASER ELEMENT

BACKGROUND OF THE INVENTION

1. Technical Field

The present invention relates a semiconductor laser device with a dielectric protective film formed on the end surface of a semiconductor layer using a nitride semiconductor, and more particularly to a high power semiconductor laser device using a nitride semiconductor substrate. A III-V group nitride semiconductor including GaN, AlN and InN, and a mixture crystal of them as AlGaN group, InGaN group and AlInGaN group can be given as the specific composition of the semiconductor device.

2. Description of Related Art

Nitride semiconductor elements have light emission from the ultraviolet range in relatively short wavelength to the visible light range comprising red, and are widely used as materials that compose a semiconductor laser diode (LD), a light emitting diode (LED), and so on. In these years, they are getting to improve the miniaturization, life, reliability and output power, and are used mainly for light sources in electronic devices, such as personal computer and DVD for electronics device, medical devices, machining devices, the optical fiber communications, and so on.

These type of nitride semiconductor elements have a laminated structure mainly having a buffer layer, an n-type contact layer, a crack prevention layer, an n-type cladding layer, an n-type light guide layer, an active layer, a p-type electron confinement layer, a p-type light guide layer, a p-type cladding layer and a p-type contact layer that are successively laminated on a sapphire substrate. In addition, a stripe-shaped ridge is formed by etching, or a current narrowing layer is formed to provide a stripe-shaped waveguide region. The n-type and p-type contact layers are provided with n-side and p-side electrodes, respectively. A current is applied through the electrodes, thus, the active layer emits light. Resonance surfaces are formed at a prescribed resonance length in the both end surfaces of the waveguide region. Laser light is emitted from the resonance surface.

Insulating protective films, or the like, are formed on the resonance surfaces to protect the semiconductor layers from air and to provide the reflectivity difference between the emission side and the rear side. The protective film on the rear side has a high reflectivity as compared with the protective film on the emission side. This can improve the output power.

In semiconductor laser device having protective films with large reflectivity difference between the rear side and the emission side, light that leaks from the waveguide region (stray light) is not prone to outgo from the rear side, and thus is emitted from the end surface on the emission side. Accordingly, the stray light may cause noise in the far-field pattern (FFP), and, as a result, non-Gaussian distribution. In order to prevent outward emission of the stray light, a non-transparent film, such as metal film, can be formed so as to cover the end surface of the substrate. (See Patent Document 1: Japanese Patent Laid-Open Publication TOKUKAI No. 2002-280663)

However, in the case where a non-transparent film is partially formed on the resonance surface on the light emission side, an additional process, such as mask-formation process, is required. Particularly, in the case where, after a wafer is divided into bar-shaped laser elements, an end surface protective film is formed on the end surface of the bar-shaped laser element, it is difficult even to form a mask in precise alignment. For this reason, it is more difficult to control the region where the end surface protective film should be formed. Particularly, in the case where a metal material is used as a non-transparent film, if the alignment control is poor, there is a problem that a short circuit may occur. In addition, in the case where a non-transparent film is formed on a large region, the bonding characteristics between the non-transparent film and the semiconductor layer or other protective film decreases due to the difference of the thermal expansion coefficient between the metal material and the semiconductor layer in the case of some materials. In this case, a problem that the non-transparent film is prone to peel off arises.

SUMMARY OF THE INVENTION

Therefore, the present invention is aimed at providing a nitride semiconductor laser device that suppresses deterioration of FFP due to stray light emitted from an end surface on the emission side to provide excellent beam characteristics, and does not improperly operate, and additionally have excellent life characteristics.

The inventor of the present invention has diligently studied to solve the above problem, and, as a result, developed the present invention. The development of the present invention is based on findings that an end surface film of a laser device controls laser light and stray light as distinguishable to be controlled by the end surface film at high level control, in other words, it can provide a laser device that has both two functions of efficient outgoing of LD light of the laser device and efficient confinement for preventing the stray light from outgoing. A nitride semiconductor laser device according to the present invention comprises a nitride semiconductor substrate 101; a nitride semiconductor layer that has an n-type semiconductor layer 102, an active layer 104 and a p-type semiconductor layer 103 laminated on or above the nitride semiconductor substrate 101, and has a stripe-shaped waveguide region for laser light; and end surface protective films 110 on the both end surfaces substantially perpendicular to the waveguide region. The nitride semiconductor substrate 101 has a luminescent radiation region 112 that absorbs light emitted from the active layer 104 and emits luminescent radiation with a wavelength longer than the wavelength of the emitted light. The end surface protective films 110 have a high reflectivity for the wavelength of the luminescent radiation from the luminescent radiation region 112. Specifically, the end surface protective films have a reflectivity for $\lambda_{ex}$ higher than $\lambda_{LD}$, where $\lambda_{LD}$ is a wavelength of the emitted light of the nitride semiconductor laser device, and $\lambda_{ex}$ is a wavelength of the luminescent radiation. In other words, an end surface protective film with a reflectivity for the laser light wavelength $\lambda_{LD}$ higher than the luminescent radiation wavelength $\lambda_{ex}$ of the substrate is used. Accordingly, the end surface protective film serves as a high reflective end surface protective film for the luminescent radiation that has a higher reflectivity for the luminescent radiation wavelength $\lambda_{ex}$. Since the end surface protective film has a transmittance for the luminescent radiation wavelength $\lambda_{ex}$ higher than the laser light wavelength $\lambda_{LD}$, it is possible to provide both preferable effects of efficient outgoing of laser light and efficient cutting-off of luminescent radiation.

Light emitted from the active layer is confined in a region sandwiched by cladding layers with a refractive index lower than the active layer in the vertical direction (the direction substantially perpendicular to the lamination plane), and, additionally, is confined in a stripe shape corresponding to a current injection region in the transverse direction (the horizontal direction relative to the lamination surface). Resonance surfaces are formed in the region where the light from the active layer is confined, thus, a stripe-shaped waveguide is formed. However, light leaks from the waveguide region to other regions. According to the present invention, a non-transparent film that does not allow the light from the waveguide region (stray light) to pass is not provided, but the end surface protective film having a high reflectivity for a wavelength that is converted and different from the stray light. Therefore, mixture of noise in laser light is suppressed. In the present invention, specifically, a high reflectivity can be approximately 50% to 100%, and preferably 70 to 100%. A low reflectivity can be the range of approximately 18% or less of the end surface of gallium nitride group compound semiconductor without protective film.

In a nitride semiconductor laser device according to a second aspect of the present invention, the end surface protective films 110 are located on the end surfaces both on the emission side and the rear side.

In this construction, it is possible to efficiently suppress outward emission of stray light. Specifically, light from the laser device is incident on PD as a detector (photo detector) that is located on a part of a light path of emitted light or reflected light opposed thereto (light from the rear-side end surface) in the resonance direction. The detector detects each light power, and the driving of the laser device is controlled based on the information. For this reason, elimination of the luminescent radiation component that is a noise component for PD improves the control. Accordingly, it is preferable that the aforementioned protective films are formed at least on the both end surfaces of the resonator as described above. In this case, it is possible to eliminate the noise component. It is more preferable that the aforementioned film is provided on end surfaces of the laser device other than the resonance end surfaces, such as side and bottom surfaces along the resonance direction. In this case, since the luminescent radiation component from the device can be almost completely eliminated, the luminescent radiation does not exist in the laser apparatus. It is possible to improve the precision of detection sensitivity of PD. On the other hand, in the laser device, since the detector is located at the position on which the emitted light or the reflected light (light from the rear-side end surface) is incident, particularly in the case where the aforementioned high reflective protective film is provided at least on the end surface side where the light is incident on the PD, this effect can be obtained. In addition, it is more preferable that the protective films are provided on the both end surfaces of the resonator as main emission outputs for light with high light intensity or density. In this case, it is possible to eliminate almost whole part of the noise component emitted from the laser device.

In a nitride semiconductor laser device according to a third aspect of the present invention, the end surface protective films 110 have a low reflectivity for the wavelength of the emitted light from the active layer 104.

In this construction, it is possible to provide an end surface protective film that allows resonance of laser light and can suppress outward emission of the luminescent radiation emitted by absorbing stray light.

In a nitride semiconductor laser device according to a fourth aspect of the present invention, the end surface protective films 110 have a single-layer or multilayer structure.

In this construction, it is possible to provide adjustment of a desired reflectivity of the end surface protective film. It is necessary to select a material of the end surface protective film in consideration not only of the reflectivity, refractive index and transmittance, but also of thermal expansion coefficient, stress, and so on. In the case of a multilayer structure, various combinations can provide an end surface protective film with more excellent function.

Furthermore, a nitride semiconductor laser device according to the another aspect of the present invention comprises a nitride semiconductor substrate 101; a nitride semiconductor layer that has an n-type semiconductor layer, 102 an active layer 104 and a p-type semiconductor layer 103 laminated on or above the nitride semiconductor substrate 101, and has a stripe-shaped waveguide region for laser light; and an emission side end surface protective film and a rear-side end surface protective film opposed thereto on the end surfaces substantially perpendicular to the waveguide region. The nitride semiconductor substrate 101 has a luminescent radiation region 112 that absorbs light emitted from the active layer 104 and emits luminescent radiation with a wavelength longer than the wavelength of the emitted light. The rear-side end surface protective film includes a first end surface protective film having a high reflectivity for the wavelength of the luminescent radiation, and a second end surface protective film having a high reflectivity for the wavelength of the emitted light from the active layer 104. The emission-side end surface protective film includes a third end surface protective film having a high reflectivity for the wavelength of the luminescent radiation. Specifically, as for the reflectivities for the laser light wavelength $\lambda_{LD}$ and the luminescent radiation wavelength $\lambda_{ex}$, this construction includes the first and third end surface protective films having a higher reflectivity for the luminescent radiation wavelength, and the second end surface protective film having a higher reflectivity for the laser light wavelength. That is, this construction has combination of the end surface protective films that have excellent reflectivities for reflection of the laser light and luminescent radiation respectively, and are provided for the end surface protective films to perform functions separated into each of the films.

In this construction, it is possible to suppress outward emission of the luminescent radiation from the rear side. As a result, it is possible to suppress improper operation in the case where a detector (photo diode) is provided on the rear side to perform the driving control, for example. Particularly, the wavelength of the luminescent radiation is longer than the light from the active layer. Accordingly, it is more detectable even if the radiation is weak. FIG. 4 is a spectral sensitivity curve of Si that is a typical photo diode (PD). Its sensitivity peak lies in the infrared region. Thus, light emission with a long wavelength is more detectable. For this reason, in the case of light emission with a relative short wavelength, e.g., in proximity of 390 to 420 nm, such as the case of a laser device of a nitride semiconductor, and in the case where luminescent radiation with a wavelength in proximity of 550 to 600 nm is emitted by absorbing the emitted light, the PD sensitivity increases nearly triple. In this case, even light other than laser light is prone to be more detectable, if it is weak. In the case where the light emitted from the rear side is not the luminescent radiation but stray light that is weak light with the same wavelength as the laser light, it is the same light as the laser light in terms of the PD sensitivity. Accordingly, the stray light does not highly affect the PD sensitivity. According to the present invention, stray light is absorbed and converted into luminescent radiation, and the end surface protective film with high reflectivity for the luminescent radiation is formed. Therefore, it is possible to suppress emission of the luminescent radiation from both of the emission side and the rear side, and, as a result, to provide excellent laser device characteristics.

In a nitride semiconductor laser device according to a sixth aspect of the present invention, the first end surface protective film and/or the third end surface protective film has a low reflectivity for the wavelength of the emitted light from the active layer 104.

In this construction, it is possible to suppress reduction of the reflectivity of the laser light due to the first and third end surface protective films, and, thus, to reduce a threshold.

In a nitride semiconductor laser device according to a seventh aspect of the present invention, the emission-side end surface protective film includes a fourth end surface protective film having a high reflectivity for the wavelength of the emitted light from the active layer 104. In addition, in a nitride semiconductor laser device according to an eighth aspect of the present invention, each of the first, second, third and fourth end surface protective films 110 has a single-layer or multilayer structure.

In this construction, the reflectivities of the emission side and the rear side can be easily adjusted to desired values. Therefore, it is possible to provide the reflectivities depending on applications.

In a nitride semiconductor laser device according to a ninth aspect of the present invention, the first and second end surface protective films are laminated so as to at least partially overlap each other. In addition, a nitride semiconductor laser device according to a tenth aspect of the present invention, the third and fourth end surface protective films are laminated so as to at least partially overlap each other.

Since the first and second end surface protective films have different wavelengths to reflect light, even in the case of lamination, they can still have high reflectivities for light with target wavelengths, respectively. The third and fourth end surface protective films have a similar effect.

In a nitride semiconductor laser device according to an eleventh aspect of the present invention, the second end surface protective film is formed in contact with the semiconductor layer. In addition, a nitride semiconductor laser device according to a twelfth aspect of the present invention, the fourth end surface protective film is formed in contact with the semiconductor layer.

The luminescent radiation has a wavelength longer than the light emitted from the active layer, and thus has low energy. In addition, since it is excited by stray light that leaks from the waveguide region, its light density is low as compared with the laser light in the waveguide region. Accordingly, in the case where an end surface protective film with a high reflectivity for the light emitted from the active layer is provided in contact with the semiconductor layer, deterioration of the end surface protective film for the luminescent radiation is suppressed. Therefore, it is possible to provide stable mode of laser light.

In a nitride semiconductor laser device according to a thirteen aspect of the present invention, the luminescent radiation region 112 has a low dislocation density as compared with the periphery thereof. Specifically, in a nitride semiconductor substrate having regions with high and low dislocation densities in the substrate plane, the region with the low dislocation density serves as the luminescent radiation region to convert light propagated in the substrate into the luminescent radiation that can be controlled by the aforementioned end surface protective film. As a result, it is possible to prevent emission of the stray light from the laser device.

In a nitride semiconductor laser device according to a fourteenth aspect of the present invention, the luminescent radiation region 112 has a high impurity concentration as compared with the periphery thereof. Specifically, in a nitride semiconductor substrate having regions with high and low impurity concentrations in the substrate plane, the region with the high concentration serves as the luminescent radiation region. In this case, it is possible to enhance the aforementioned structures and effects.

In a nitride semiconductor laser device according to a fifteen aspect of the present invention, the impurity is at least one element selected from the group consisting of H, O, C and Si.

In a nitride semiconductor laser device according to a sixteen aspect of the present invention, the active layer 104 has a light emission wavelength of 390 to 420 nm.

In a nitride semiconductor laser device according to a seventeen aspect of the present invention, the luminescent radiation has a a wavelength of 550 to 600 nm.

In a nitride semiconductor laser device according to an eighteen aspect of the present invention, the luminescent radiation region 112 is formed in a stripe shape substantially parallel to the waveguide region. Specifically, the aforementioned high impurity region or low dislocation density region in the substrate plane is formed in a stripe shape as the luminescent radiation region, and is arranged such that the stripe direction is substantially parallel to the stripe direction of a ridge stripe as the waveguide. In this parallel arrangement, light leaks in the vertical and transverse directions from the stripe-shaped waveguide region as a source serves as light to be converted into the luminescent radiation. As a result, the arrangement of the waveguide region and the luminescent radiation region parallel to each other suitably provides the aforementioned light conversion and luminescent radiation.

In a nitride semiconductor laser device according to a nineteenth aspect of the present invention, the waveguide region is formed above the luminescent radiation region 112. Specifically, the waveguide region of the semiconductor layer is provided such that the aforementioned high impurity region or low dislocation density region as the luminescent radiation region at least partially overlaps the region in the substrate plane. It is preferable that the luminescent radiation region covers almost the whole waveguide region. In the case where the whole laser construction has a ridge waveguide structure, in order to be overlapped the stripe-shaped ridge in the substrate plane, it is preferable that the luminescent radiation region with a width wider than the ridge stripe overlaps the ridge. In this case, it is possible to provide efficient luminescent radiation and light conversion of stray light.

In a nitride semiconductor laser device according to a twentieth aspect of the present invention, the waveguide region is formed in a region that is spaced away from the luminescent radiation region 112. Specifically, the luminescent radiation region and the waveguide region of the laser device structure on the substrate are spaced away from each other. In the case where the luminescent radiation region and the waveguide region have stripe shapes, a structure having the stripe shapes that extend along substantially the same longitudinal direction in parallel to each other can be given as an example.

A laser apparatus according to a twenty-first aspect of the present invention comprises the aforementioned nitride semiconductor laser device, and a detector of PD (photo diode) that detect the laser light. The PD has a spectral sensitivity in a luminescent radiation wavelength $\lambda_{ex}$ higher than a laser light wavelength $\lambda_{LD}$. In other words, the laser apparatus includes a photo diode with a spectrum sensitivity of [sensitivity for $\lambda_{LD}$]<[sensitivity for $\lambda_{ex}$] as the detector. In the laser apparatus having PD with a high sensitivity for luminescent radiation, even if small leakage of luminescent radiation seriously affect a laser apparatus, confinement of luminescent radiation by the aforementioned end surface protective film properly functions, and thus can provide precise control of LD driving. Since a Si semiconductor typically used as a photodiode is not a PD less sensitive for a wavelength region of a wide band gap nitride semiconductor laser device, it is difficult to precisely control the nitride semiconductor laser device in a laser apparatus using the PD as a detector. However, the present invention can solve this problem. In reference to the laser apparatus, specifically, there is a CAN type laser apparatus having a laser device chip and a PD chip that are mounted on mount portions, respectively, and are connected to terminals in the laser apparatus by wires, and so on. In addition to this CAN type laser device apparatus, there is a laser apparatus having an integrated laser coupler with a laser device chip, a PD chip and a circuit that drives them and provides external terminals. As for a laser coupler, there is a laser apparatus composed of a stuck device that has a laser device chip and a PD chip laminated and mounted thereon, and an additional mount substrate and a base body that are provided with the laser device side and the PD chip side mounted thereon, respectively. Laser devices, in this case, are not limited to only one type of the aforementioned nitride semiconductor laser device, but can include second laser device that emits laser light with different wavelength. That is, this type of laser apparatus can be a multi-wavelength laser apparatus with a plurality of laser devices.

A nitride laser semiconductor laser device according to the present invention absorbs stray light inside the substrate, and thus suppresses FFP deterioration due to mixture of the stray light into laser light. In addition, the laser device absorbs the stray light and emits luminescent radiation, and has a high reflective end surface protective film formed therein such that the luminescent radiation is not emitted outward. Therefore, the laser device can provide more stable laser light. Furthermore, a high reflective end surface protective film is also formed on the rear side to prevent improper operation of a detector due to the luminescent radiation with a wavelength longer than light emitted from the active layer, thus, precise driving control can be obtained. Therefore, it is possible to provide an excellent reliable semiconductor laser device.

DETAILED DESCRIPTION OF THE PREFERRED EMBODIMENTS

The following description will describe a nitride semiconductor laser device according to the present invention, however, the present invention is not limited to a device structure shown in embodiments.

The nitride semiconductor laser device according to the present invention includes a nitride semiconductor substrate having a luminescent radiation region that absorbs light emitted from an active layer and emits luminescent radiation with a wavelength longer than the wavelength of the emitted light, and thus suppresses outward emission of light (stray light) that leaks from a laser light waveguide region. This can provide suitable device characteristics.

Figure 1:
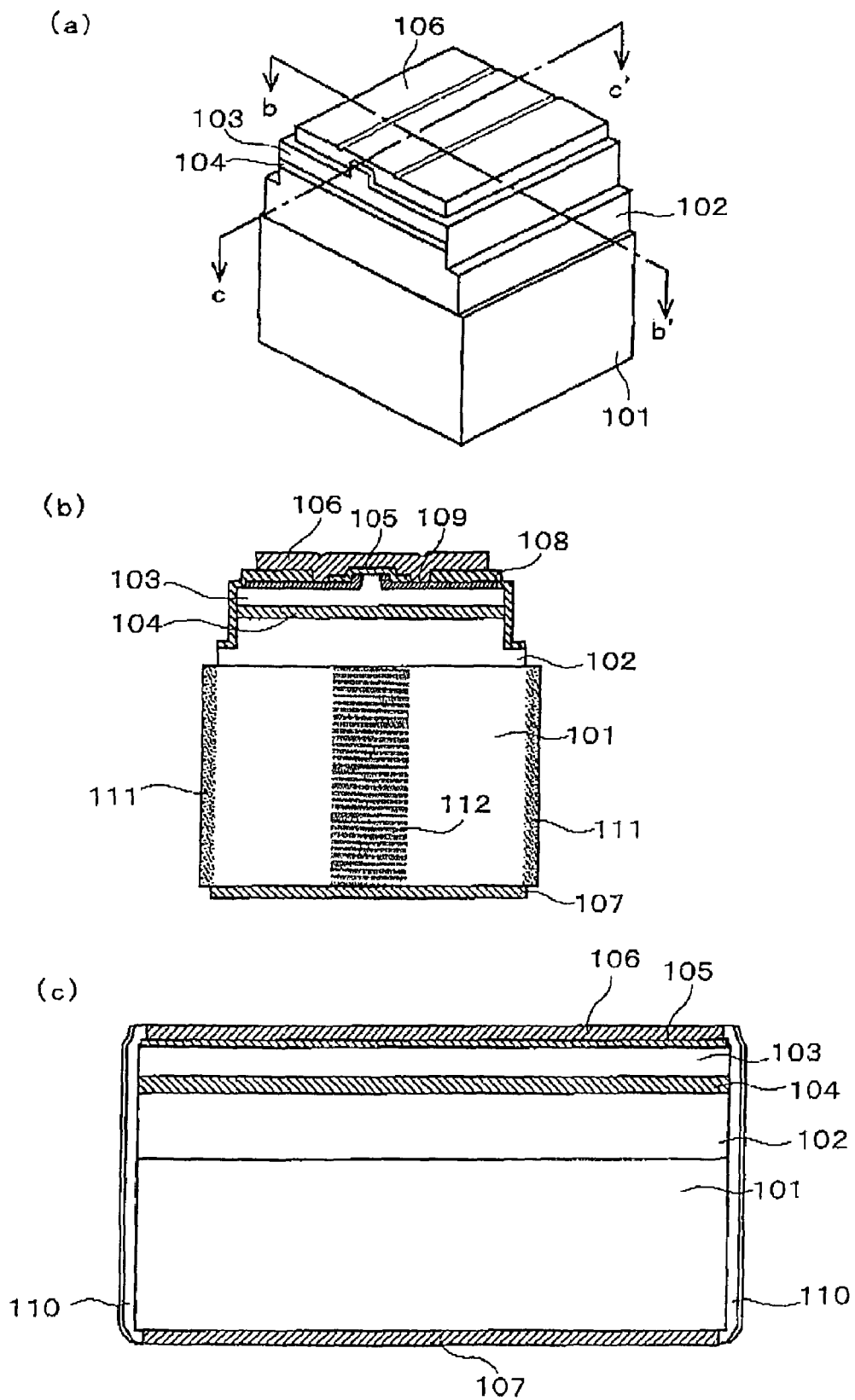
FIG. 1(a) is a schematic perspective view for explanation of a semiconductor laser device according to the present invention.
FIG. 1(b) is a cross-sectional view of FIG. 1(a) along a line b-b'.
FIG. 1(c) is a cross-sectional view of FIG. 1(a) along a line c-c'.

FIG. 1 shows the construction of the nitride semiconductor laser device according to this embodiment. The nitride semiconductor laser device according to the present invention includes an n-type nitride semiconductor layer 102, an active layer 104 and a p-type nitride semiconductor layer 103 that are laminated on a nitride semiconductor substrate 101. The p-type nitride semiconductor layer is provided with a stripe-shaped ridge. The ridge can be formed by removing a part of the p-type nitride semiconductor layer in an etching method, and so on, and thus provides an effective refraction type waveguide. In addition, the ridge may be formed to provide a refraction type waveguide by etching a part of the p-type to n-type nitride semiconductor layers. Alternatively, the ridge may be formed in a selective growing method. The ridge is not limited to a normal mesa shape with wide stripe width on the bottom side and decreasing as closer to the top. The ridge may be an inverse mesa shape with width decreasing as closer to the ridge bottom. In addition, the ridge may be a stripe with side surfaces perpendicular to the lamination plane, or may be a shape of combination of them. It is not necessary that a stripe-shaped waveguide has a substantially constant width. Furthermore, a buried type laser having semiconductor layers that are formed on the ridge surface and beside the ridge after the ridge is formed may be used. Moreover, a gain waveguide type laser without ridge may be used.

A first insulating film 109 is formed on the side surface of the ridge and the top surface of the p-type nitride semiconductor layer contiguous to the ridge. A p-side ohmic electrode 105 is provided on the top surfaces of the ridge and the first insulating film. An n-side ohmic electrode 107 is provided on the back surface of the nitride semiconductor substrate. A second insulating film 108 that covers the side surfaces of the semiconductor layer is continuously provided to the upper part of the first insulating film. A p-side pad electrode 106 in contact with the second insulating film and the p-side ohmic electrode is provided on the upper part of the p-type nitride semiconductor layer.

(Nitride Semiconductor Substrate)

GaN, AlN and InN, and a mixture crystal of them as AlGaN group. InGaN group and AlInGaN group can be given as the composition of the substrate to be used. The substrate can be produced as follows.

A nitride semiconductor with a thickness of 100 μm or more is thickly grown on a different material substrate by a hydride vapor-phase-epitaxy method (hereinafter referred to as a HVPE method). After that, the different material substrate is removed, thus, the nitride semiconductor as the substrate can be provided. The surface of the nitride semiconductor after the substrate is removed is $(000\bar{1})$ plane. Inclined surfaces other than $(000\bar{1})$ plane are formed by dry etching, wet etching or chemical-mechanical polishing (hereinafter, referred to as CMP). In the case where the half-value width of the nitride semiconductor of a (0002) diffraction X-ray rocking curve in a biaxial crystal method is three minute or less, preferably two minutes or less, the nitride semiconductor is less prone to be damaged even in a process for removing the different substrate. Accordingly, it is possible to provide a nitride semiconductor with a thickness of 100 μm or more that retains excellent crystallinity. Subsequently, a new nitride semiconductor element is formed on (0001) plane of the nitride semiconductor. In addition, a first electrode is formed on the back surface of the nitride semiconductor.

The nitride semiconductor is represented by a general formula of $In_XAl_YGa_{1-X-Y}N$ ($0 \leq X \leq 1$, $0 \leq Y \leq 1$, $0 \leq X+Y \leq 1$). The nitride semiconductor is preferably formed above the different material substrate so as to interpose a buffer layer represented by $Al_aGa_{1-a}N$ ($0.01 < a \leq 0.5$) between them. The reason is to improve its crystallinity. The buffer layer is grown at a low growth temperature of 800° C. or less. This growth can reduce dislocation and pits in the nitride semiconductor. After the buffer layer is grown on the different material substrate by a metal-organic chemical vapor deposition method (hereinafter, referred to as a MOCVD method), a layer of $Al_XGa_{1-X}N$ ($0 \leq X \leq 1$) may be additionally grown by an epitaxially lateral overgrowth method (ELO method). The ELO method laterally grows a nitride semiconductor to bend threading dislocation, an additionally to converge the threading dislocation. This reduces the threading dislocation on the surface side, and thus improves its crystallinity.

Various substrates, such as GaAs substrate, sapphire substrate, SiC substrate, Si substrate, spinel substrate, $NdGaO_3$ substrate, ZnO substrate, GaP substrate and GaN substrate, and so on, can be sued as a growth substrate for growing the nitride semiconductor substrate.

In the case the nitride semiconductor layer is grown by a growth method that laterally grows the layer as described above, and is used as the substrate, it is possible to provide a substrate in which the dislocation density (defect density), or the like, are not uniform in a location corresponding to a shape of the growth starting point. In addition, it is preferable that the layer is grown while an impurity is doped. In this case, a region with non-uniform impurity concentration is also formed so as to correspond the distribution state of the aforementioned dislocation density.

As for a low dislocation density region as described above, its distribution state can be selected by the shape of the growth starting point. Since the laser light waveguide region is formed in a stripe shape, the growth starting point is preferably formed in a stripe shape corresponding to it. In the case where a nitride semiconductor layer is grown from growth starting points that are cyclically arranged in a stripe shape, it is possible to provide a nitride semiconductor substrate that cyclically is provided with a region that has a low dislocation density and excellent crystallinity, and, on the other hand, a region that has much dislocation and poor crystallinity (dislocation flux). A nitride semiconductor layer is less prone to grow on the dislocation flux. Such a nitride semiconductor layer grown thereon has poor crystallinity. For this reason, it is prone to affect adversely when the device is driven. Accordingly, it is preferable that an operation region such as a waveguide region is formed in a region other than the dislocation flux. For example, deterioration of the device characteristics can be suppressed by adjustment of the region to be located in proximity of the device division position, as shown in FIG. 1(b).

The nitride semiconductor substrate is formed to be conductive by doping an impurity. In this case, an n-electrode can be provided on the substrate back surface side, as shown in FIG. 1. The substrate can be an insulating or low conductive substrate. In this case, the n-electrode is provided on the same plane side as a p-electrode 105. In terms of strength, and so on, in handling, the nitride semiconductor substrate preferably has a thickness of approximately 100 μm.

(Luminescent Radiation Region)

The nitride semiconductor substrate that is grown on the growth substrate as described above includes a region where it is laterally grown. Accordingly, its crystal characteristics are less prone to be uniform in the plane. For this reason, regions with different dislocation densities and impurity concentrations are formed. Particularly, since the region with a low dislocation density tends to absorb the wavelength of light emitted from the active layer as compared with the region with a high density, it serves as the luminescent radiation region. Depending on the type of employed growth substrate, the growth condition of nitride semiconductor layer (temperature, gas flow rate, pressure, and type and concentration of impurity), and so on, the state of the formed luminescent region varies. Accordingly, the boundary between the luminescent radiation region and a non-luminescent radiation region is not clear. A luminescent radiation region that emits low luminescent radiation in almost the whole surface can be formed. On the other hand, a luminescent radiation region 112 that locally emits high luminescent radiation as shown in FIG. 1(b) can be formed. A preferable form of these types can be selected depending on the purpose and application. The shape and distribution of the luminescent radiation of the substrate depends on the type and growth condition of the aforementioned substrate.

In addition, it is preferable that the luminescent radiation region is formed so as to correspond to the laser light waveguide region, specifically, such that the luminescent radiation region and the waveguide region or the ridge stripe overlap each other in the substrate plane.

Additionally, in the case where the waveguide region is formed in the nitride semiconductor layer that is grown on the luminescent radiation region, it is possible to provide an excellent waveguide region for laser light. In the case where the luminescent radiation region is formed in the location corresponding to the waveguide region, it is possible to improve the absorption efficiency of stray light. For this reason, the luminescent radiation region is preferably provided in proximity to the waveguide region. However, too much absorption may cause threshold to increase. In this case, the waveguide region is spaced away from the luminescent radiation region, specifically, the luminescent radiation region and the waveguide region or the ridge stripe are spaced away from each other. Thus, the waveguide region can be formed in a grown nitride semiconductor. The luminescent radiation region is only required to be able to absorb the wavelength of light emitted from the active layer and to emit luminescent radiation. Specifically, the luminescent radiation region is only required to provide high luminescent radiation as compared with a partial region other than the luminescent radiation region. Accordingly, in addition to adjustment of dislocation density or impurity by the aforementioned nitride semiconductor substrate growth method, the luminescent radiation region can be formed by ion implantation, or the like, in the later processes.

(End Surface Protective Film 110)

In the present invention, the end surface protective films have a high reflectivity for the wavelength of the luminescent radiation from the luminescent radiation region. The end surface protective film can have a single-layer or multilayer structure. Since the luminescent radiation is emitted by absorbing stray light that leaks from the waveguide region, its intensity is low as compared with laser light outwardly emitted from the waveguide region. For this reason, it is preferable that its reflectivity is set to a certain degree that does not prevent laser light emission. Its thickness is preferably small. The reason is that, although the laser light is less prone to be reflected due to the wavelength difference, it may be absorbed in the case of some materials. In addition, although the laser light passes the end surface protective film, the end surface protective film causes loss more or less.

The end surface protective film is provided with not only an end surface protective film for the wavelength of the luminescent radiation, but also an end surface protective film for the wavelength of laser light. Accordingly, it is possible to efficiently emit laser light. The rear-side end surface protective film includes a first end surface protective film having a high reflectivity for the wavelength of the luminescent radiation, and a second end surface protective film having a high reflectivity for the wavelength of the emitted light from the waveguide region. In addition, the emission-side end surface protective film includes a third end surface protective film having a high reflectivity for the wavelength of the luminescent radiation, and a fourth end surface protective film having a high reflectivity for the wavelength of the emitted light from the active layer.

Although either of the first and second end surface protective films can be contact with the semiconductor layer, it is preferable that the second end surface protective film is in contact with the semiconductor layer. In this case, it is possible to suppress deterioration of the first end surface protective film.

In the case where the third end surface protective film is only provided on the emission-side end surface, its thickness is set to a high reflectivity for the wavelength of the luminescent radiation, and the film with the set thickness is provided on the whole emission-side end surface. Although the third end surface protective film is required to be provided only a region where the luminescent radiation is emitted outward, it is provided the end surface to serve as a protective film that prevents the exposure of the semiconductor layer including the active layer, and so on, to air. Since the luminescent radiation and the laser light have different wavelengths, the laser light is less prone to be cut off. Specifically, in the case where the luminescent radiation region and the waveguide region corresponds to each other as described above, it is preferable that the protective film is provided so as to cover the luminescent radiation region on the substrate end surface, more preferably to cover, in the substrate and the device structure located thereon, the luminescent radiation region of the substrate and the waveguide region on the end surface of the device structure including the active layer.

In addition to the third end surface protective film, the fourth end surface protective film can be provided on the emission-side end surface. In this case, when the fourth end surface protective film is in contact with the semiconductor layer, it is possible to suppress deterioration of the third end surface protective film due to the laser light with high light density. In addition, adjustment of reflectivity by the protective film disposed on the emission side can provide efficient laser light emission, and thus can reduce the threshold. The luminescent radiation is not reflected by the fourth protective film and passes the fourth protective film. It is reflected by the first protective film, and thus does not outgo.

Specifically, at least one conductive material selected from the group consisting of Si, Mg, Al, Hf, Nb, Zr, Sc, Ta, Ga, Zn, Y, B, Ti, and a compound such as oxides, nitride and fluoride of them can be employed as a material of the end surface protective film. Only one material of them can be employed. Alternatively, a plurality of materials among them can be employed as a compound or multi layers. A material employing Si, Mg, Al, Hf, Zr, Y, or Ga is preferable. In addition, a semiconductor material such as AlN, AlGaN and BN can be employed. As for an insulating material, a compound, such as oxide, the nitride and fluoride of Si, Mg, Al, Hf, Nb, Zr, Sc, Ta, Ga, Zn, Y and B, can be employed.

The following combinations can be given as preferable materials of the first to fourth end surface protective films, for example.

A: First End Surface Protective Film (Rear-Side End Surface Protective Film for Luminescent Radiation)
  $GaN/ZrO_2$+one to three pair(s) of ($SiO_2/ZrO_2$)
  $GaN/TiO_2$+one to three pair(s) of ($SiO_2/TiO_2$)

B: Second End Surface Protective Film (Rear-Side End Surface Protective Film for Light Emission of Active Layer)
  $GaN/ZrO_2$+three to six pairs of ($SiO_2/ZrO_2$)
  $GaN/TiO_2$+three to six pairs of ($SiO_2/TiO_2$)

C: Third End Surface Protective Film (Emission-Side End Surface Protective Film for Luminescent Radiation)
  GaN/one or two pair(s) of ($SiO_2/Nb_2O_5$)
  GaN/one or two pair(s) of ($Al_2O_3/Nb_2O_5$)
  GaN/one or two pair(s) of ($Al_2O_3/TiO_2$)
  $GaN/Al_2O_3$+one or three pair(s) of ($SiO_2/Nb_2O_5$)

D: Fourth End Surface Protective Film (Emission-Side End Surface Protective Film for Light Emission of Active Layer)
  $GaN/ZrO_2$+one to three pair(s) of ($SiO_2/ZrO_2$)
  $GaN/TiO_2$+one to three pair(s) of ($SiO_2/TiO_2$)

In the aforementioned combinations, thickness adjustment depending on the wavelengths can provide a laser device with excellent characteristics.

(Electrode)

A material having good ohmic characteristics and bonding characteristics for the p-type nitride semiconductor layer can be employed as an electrode material of the p-side ohmic electrode that is provided on the p-type nitride semiconductor layer. Specifically, Ni, Co, Fe, Cr, Al, Cu, Au, W, Mo, Ta, Ag, Pt, Pd, Rh, Ir, Ru, Os, and oxide and nitride of them can be given as the examples. A single layer, alloy or multi layers of them can be used. At least one element selected from the group consisting of Ni, Co, Fe, Cu, Au and Al, and oxide and nitride of them are preferable.

Thermal treatment can provide excellent ohmic characteristics of the p-side ohmic electrode. The thermal treatment temperature is preferably in the range of 350° C. to 1200° C., more preferably 400° C. to 750° C., and most preferably 500° C. to 650° C.

In addition, Ni, Co, Fe, Ti, Cu, Au, W, Mo, Zr, Ta, Ag, Pt, Pd, Rh, Ir, Ru, Os, and oxide and nitride of them can be given as the examples of the p-side pad electrode 106. A single layer, alloy or multi layers of them can be used. Since the top layer thereof is connected to the wire, or the like, Au is preferably employed as the top layer. In order to prevent Au diffusion, a material with a relatively high melting point is preferably employed as a lower layer to serve as a diffusion prevention layer. For example, Ti, Pt, W, Ta, Mo, TiN, and so on, can be given as the example. Particularly, Ti can be given as a preferable material. As for thickness, the total thickness is preferably in the range of 3000 Å to 20000 Å, more preferably 7000 Å to 13000 Å.

As for the n-electrode that is provided on the n-type nitride semiconductor, in the case where the nitride semiconductor substrate is conductive, it is preferably provided on the back surface of the substrate. Alternatively, it may be formed on a surface exposed by etching, or the like. In addition, it may be formed on an n-type contact layer. In the case where it is provided on the same plane side as the p-electrode, the ohmic electrode and the pad electrode can be formed in the same process or different processes. Additionally, the thermal treatment can be omitted in the case of some materials.

A material having good ohmic characteristics and bonding characteristics for the n-type nitride semiconductor layer can be employed as an electrode material of the n-side ohmic electrode. Specifically, Ni, Co, Fe, Ti, Cu, Au, W, V, Zr, Mo, Ta, Al, Ag, Pt, Pd, Rh, Ir, Ru, Os, and so on, can be given as the examples. A single layer, alloy or multi layers of them can be used. A multilayer structure with Ti and Al that are successively laminated is preferably used. In order to provide good ohmic characteristics for the semiconductor layer, after the n-side ohmic electrode is formed, thermal treatment is preferably performed in the case of some materials. As for the thickness of the n-side ohmic electrode, the total thickness is preferably about 100 Å to 30000 Å, more preferably 3000 Å to 15000 Å, and most preferably 5000 Å to 10000 Å. It is preferable that the n-side ohmic electrode is formed within the range. The reason is that an electrode with a low contact resistance can be provided in this case.

In addition, Ni, Co, Fe, Ti, Cu, Au, W, Zr, Mo, Ta, Al, Ag, Pt, Pd, Rh, Ir, Ru, Os, and so on, can be given as the examples of the n-side pad electrode. A single layer, alloy or multi layers of them can be used. The n-side pad electrode preferably has a multilayer structure. Since the top layer thereof is connected to the wire, or the like, Au is preferably employed as the top layer. In order to prevent Au diffusion, a material with a relatively high melting point is preferably employed as a lower layer to serve as a diffusion prevention layer. For example, Ti, Pt, W, Mo, TiN, and so on, can be given as the examples. As for thickness, the total thickness is preferably in the range of 3000 Å to 20000 Å, more preferably 7000 Å to 13000 Å.

The n-side electrode may not be formed similarly to the ohmic electrode and the pad electrode formed in different processes as described above but may be continuously formed and have both functions. That is, the n-electrode can serves as an ohmic electrode in ohmic contact with the semiconductor layer and an attachment electrode (pad electrode) that is connected to the wire. The reason is that the n-side electrode can relatively easily provide ohmic contact for the n-type semiconductor layer as compared with the p-side electrode. In addition, since it is formed on a region spaced away from the waveguide region to a small extent, it is not very necessary to take its optical characteristics into consideration. Accordingly, it has flexibility in material. As for the thickness of the n-electrode, the total thickness is preferably in the range of 3000 Å to 20000 Å, more preferably 7000 Å to 13000 Å. Ti/Al, Hf/Al, Ti/Pt/Au, Ti/Mo/Pt/Au, Ti/Mo/Ti/Pt/Au, Ti/W/Pt/Au, Ti/W/Ti/Pt/Au, Mo/Pt/Au, Mo/Ti/Pt/Au, W/Pt/Au, V/Pt/Au, V/Mo/Pt/Au, V/W/Pt/Au, Cr/Pt/Au, Cr/Mo/Pt/Au, Cr/W/Pt/Au, and so on, can be given as preferable combinations. In the case where the n-electrode is formed on the substrate back surface, a current can be applied by bonding it with Au/Sn.

The first insulating film is provided to limit a current injection region to the ridge top surface. However, since the first insulating film is located in proximity to the waveguide region, it has an effect on light confinement efficiency. A preferable thickness of the first insulating film can be selected depending on an insulating film material to be used. The first insulating film can be formed so as to have substantially the same width as the nitride semiconductor layer. The first insulating layer that is formed before the p-side ohmic electrode is subjected to the thermal treatment together with the ohmic electrode in the thermal treatment process for the ohmic electrode. The thermal treatment increases the strength of the film (atomic-level bonding force in the film) as compared with a film as deposited, and thus improves the bonding intensity at the interface with the semiconductor layer in between. Particularly, in the case where this type of first insulating film is formed to the end of the semiconductor layer top surface where the second insulating film is formed, it is possible to improve the bonding characteristics of the second insulating film.

In addition, the p-side pad electrode can be formed so as not to be in contact with the second insulating film. Particularly, in the case of junction-down bonding, heat is conducted to the p-side pad electrode. At this time, its volume increases due to the thermal expansion, thus, it tends to move toward the side surface of the device (toward the end of the p-type semiconductor layer). Additionally, not only heat but also pressure is applied, thus, the electrode material tends to move toward the side surface. In the case where the p-side pad electrode is spaced away from the second insulating film, it is possible to prevent a short circuit due to the moving of the electrode material of the p-side pad electrode toward the side surface.

The first insulating film is preferably formed of a material of an oxide containing at least one element selected from the group consisting of Si, Ti, V, Zr, Nb, Hf and Ta, or at least one material selected from the group consisting SiN, BN, SiC, AlN and AlGaN, and more preferably of an oxide of Zr, Hf or Si, or BN, AlN or AlGaN among them.

Specifically, the thickness of the first insulating film is set to the range between not less than 10 Å and not more 10000 Å, and preferably between not less than 100 Å and not more than 5000 Å. The reason is that, if it is less than 10 Å, it is difficult to ensure sufficient insulation, when the electrode is formed. On the other hand, if it is more than 10000 Å, the protective film is not uniform, thus, an excellent insulating film can not provided. In addition, in the case where the thickness falls within the above range, a uniform film with an excellent refractive index difference between the film and the ridge is formed on the ridge side surfaces.

The second insulating surface can be provided on the whole surface of the p-side ohmic electrode except for the ridge top surface. In addition, it is preferable that the second insulating film is continuously provided the side end surface of the p-type semiconductor layer and the active layer exposed by etching. The film is preferably formed of a material of an oxide containing at least one element selected from the group consisting of Si, Ti, V, Zr, Nb, Hf and Ta, or at least one material selected from the group consisting SiN, BN, SiC, AlN and AlGaN. Single layer film or multilayer film of $SiO_2$, $Al_2O_3$, $ZrO_2$ and $TiO_2$ can be given as a more preferable material among them.

Furthermore, a pair of resonance surfaces that are provided on the end surfaces to specify the resonance direction along the stripe direction of the aforementioned ridge can be formed by cleavage, etching, or the like. In the case where the resonance surfaces are formed by cleavage, the substrate and the semiconductor layer preferably have cleavage characteristics. An excellent mirror surface can be obtained by using the cleavage characteristics. In addition, in the case where they do not have the cleavage characteristics, the resonance surfaces can be formed by etching. In this case, the resonance surfaces are formed in the same process as exposure of the n-electrode formation surface, and thus can be provided by fewer processes. Additionally, they can be formed in the same process as the ridge formation. Although the formation of them in the same process as other process as described above can reduce the number of processes, a separated process for the formation of resonance surfaces is preferably included in order to provide a more excellent resonance surfaces.

Specifically, in the case where the resonance surfaces are etched end surfaces, for example, after the etched end surfaces are formed, the high reflective (second and fourth) end surface protective films for laser light are provided on the end surfaces (emission and reflection sides), then the substrate is cleaved such that the wafer is divided into bar-shaped elements as described later. After that, the high reflective (first and third) end surface protective films for luminescent radiation are formed so as to cover the exposed substrate end surfaces and the etched surfaces. In this case, the etched end surface and the substrate end surface can have different film structures (different numbers of layers, where the end surface is for both the laser light and luminescent radiation, and the substrate end surface is for luminescent radiation).

EXAMPLE 1

The following description will describe examples. However, a device structure of the n-type nitride semiconductor layer, active layer and p-type nitride semiconductor layer that compose the nitride semiconductor layer according to the present invention is not specifically limited to them, various lamination structure can be used. Laser device structures described in the following examples can be used, however, other device structures can be applied. A III-V nitride semiconductor group semiconductor including a nitride semiconductor such as GaN, AlN and InN, and a mixture crystal of them can be employed. Additionally, A III-V nitride semiconductor group semiconductor containing B, P, and so on, can be used. Any known methods that grows a nitride semiconductor, such as MOVPE, MOCVD (metalorganic chemical vapor deposition), HVPE (halide vapor-phase epitaxiay), MBE (molecular beam epitaxy), and so on, can be used for growth of the nitride semiconductor.

(Nitride Semiconductor Substrate)

First, a 2-inch different material substrate of sapphire having C-plane as primary surface is set in a MOCVD reactor vessel. A buffer layer of GaN with a thickness of 200 Å is grown thereon at temperature of 500° C. by using trimethyl gallium (TMG), and ammonia (NH3). In addition, a foundation layer of GaN with a thickness of 2.5 μm is grown at temperature of 1000° C. or more. After that, it is moved to a HVPE reactor vessel. A nitride semiconductor of GaN with a thickness of 500 μm is grown by using Ga metal, HCl gas and ammonia as materials. Subsequently, only the sapphire is peeled off by excimer laser irradiation, and a nitride semiconductor with a thickness of 450 μm is formed by performing CMP.

(N-Type Contact Layer)

An n-type contact layer of Si-doped n-$Al_{0.02}Ga_{0.98}N$ with a thickness of 3.5 μm is grown at 1050° C. similarly by using TMG and ammonia gas as source gases, and a silane gas as an impurity gas. The thickness of the n-type contact layer is not limited as long as it falls within the range 2 to 30 μm.

(Clack Prevention Layer)

Subsequently, a clack prevention layer of Si-doped n-$In_{0.05}Ga_{0.95}N$ with a thickness of 0.15 μm is grown at 800° C. by using TMG, TMI (trimethyl indium) and ammonia.

In addition, in the case where the nitride semiconductor substrate is a conductive substrate and is provided an n-electrode that is formed on the back surface of the substrate after a substrate for growth is removed, it is possible to start laminating the following n-type cladding layer on the nitride semiconductor substrate.

(N-Type Cladding Layer)

Subsequently, a layer A of undoped $Al_{0.05}Ga_{0.095}N$ and a layer B of Si-doped GaN with the same thickness of 50 Å are grown at temperature of 1050° C. by using TMA (trimethyl aluminum), TMG and ammonia as source gases. These formation steps are repeated 110 times each to alternately laminate the layers A and B, thus, the n-type cladding layer of multilayer film (superlattice structure) with the total thickness of 1.1 μm is grown. In this case, when the mixture ratio of Al in the unoped AlGaN falls within the range between not less than 0.02 and not more than 0.3, it is possible to obtain the sufficient refractive index difference that provide the function of cladding layer, and even a single layer structure can be formed.

(N-Type Light Guide Layer)

Subsequently, an n-type light guide layer of undoped GaN with a thickness of 0.15 μm is grown at a similar temperature by using TMG and ammonia as source gases. An n-type impurity may be doped in this layer.

(Active Layer)

Subsequently, a barrier layer of Si-doped $In_{0.02}Ga_{0.98}N$ with a thickness of 140 Å is grown at temperature of 800° C. by using TMI (trimethyl indium), TMG and ammonia as source gases, and a silane gas as an impurity gas. Then, the silane gas is stopped, and a well layer of undoped $In_{0.1}Ga_{0.9}N$ with a thickness of 70 Å is grown. These formation steps are repeated twice each, and then the barrier layer of Si-doped $In_{0.02}Ga_{0.98}N$ with a thickness of 140 Å is finally grown. Thus, an active layer of multiquantum well structure (MQW) with the total thickness of 560 Å is grown.

(P-Type Electron Confinement Layer)

A p-type electron confinement layer of Mg-doped $Al_{0.25}Ga_{0.75}N$ with a thickness of 30 Å is grown at a similar temperature under a $N_2$ atmosphere. Subsequently, another p-type electron confinement layer of Mg-doped $Al_{0.25}Ga_{0.75}N$ with a thickness of 70 Å is grown under a $H_2$ atmosphere.

(P-Type Light Guide Layer)

Subsequently, a p-type light guide layer of undoped GaN with a thickness of 0.15 μm is grown at temperature of 1050° C. by using TMG and ammonia as source gases. This p-type light guide layer is grown as an undoped layer, however, Mg may be doped therein.

(P-Type Cladding Layer)

Subsequently, a layer A of undoped $Al_{0.08}Ga_{0.92}N$ with a thickness of 80 Å is grown, and a layer B of Mg-doped GaN with a thickness of 80 Å is grown thereon. These formation steps are repeated 28 times each to alternately laminate the layers A and B, thus, the p-type cladding layer of multilayer film (superlattice structure) with the total thickness of 0.45 μm is grown. In the case where the p-type cladding layer is formed in a superlattice structure that has laminated nitride semiconductor layers with band gaps different from each other at least one of which is a semiconductor layer containing Al, when any one of them has a doped impurity concentration higher than the other, in other words, when modulation doping is performed, their crystallinity tends to be better. However, they may have the same doped impurity concentration.

(P-Type Contact Layer)

Finally, a p-type contact layer of Mg-doped GaN with a thickness of 150 Å is grown at 1050° C. on the p-type cladding layer. The p-type contact layer can be formed of p-type $In_xAl_yGa_{1-x-y}N$ ($0 \leq x$, $0 \leq y$, $x+y \leq 1$). It is preferably formed of Mg-doped GaN. The reason is that, in this case, the most preferable ohmic contact can be obtained. After reaction, the wafer is annealed at 700° C. under a nitrogen atmosphere in a reactor vessel to reduce resistance of the p-type layers.

(Exposure of N-Type Layer)

After the nitride semiconductor layers are grown and thus compose the lamination structure as described above, the wafer is moved from the reactor vessel. A protective film of $SiO_2$ is formed on the surface of the p-type contact layer as the top layer. The surface of the n-type contact layer is etched to be exposed by RIE (reactive ion etching) with a $Cl_2$ gas. In addition, resonance surfaces may be formed in this process. Additionally, in the case where the n-electrode is provided on the back surface of the substrate as shown in a later-described example 3, the n-electrode formation surface is not required. Accordingly, this process can be eliminated.

(Ridge Formation)

Subsequently, in order to form a stripe shaped waveguide region, after a protective film of Si oxide (mainly $SiO_2$) with a thickness of 0.5 μm is formed on almost the whole p-type contact layer as the to player by a CVD device, a mask with a prescribed shape is formed on the protective film by a photolithography technique. A RIE device etches it with a $CHF_3$ gas, and thus the stripe-shaped protective film of Si oxide is formed. This protective film of Si oxide serves as a mask, and the semiconductor layers are etched with a $SiCl_4$ gas, thus, the ridge stripe is formed above the active layer. In this case, the ridge has a width of 1.6 μm.

(First Insulating Film)

In the state where the $SiO_2$ mask is formed, a first insulating film of $ZrO_2$ with a thickness of 550 Å is formed on the p-type semiconductor layer. The first insulating film can be formed on the whole semiconductor layer after an n-side ohmic electrode formation surface is masked. In addition, in order to easily divide the wafer, a portion where the insulating film is not formed may be provided.

After the first insulating film is formed, thermal treatment is performed on the wafer at 600° C. In the case where the first insulating film of a material other than $SiO_2$ is formed as described above, after the first insulating film is formed, the thermal treatment is performed in the range between not less than 300° C., preferably not less than 400° C. and not more than a decomposition temperature of nitride semiconductor (1200° C.), thus, the insulating material can be stable. Particularly, in the case where device processing is performed by mainly using $SiO_2$ as a mask in a process after the first insulating film is formed, the first insulating film can provide resistance for dissolution against a material for dissolving the mask used in a process the $SiO_2$ mask is removed. The thermal treatment process of the first insulating film can be eliminated depending on materials and processes of the first insulating film. In addition, the process order, and so on, can be suitably selected. For example, the thermal treatment process can be performed in the same process as thermal treatment of the ohmic electrode. After thermal treatment, the wafer is soaked in a buffered solution to dissolve and remove $SiO_2$ formed on the top surface of the ridge stripe. $ZrO_2$ on the p-type contact layer (additionally, on the n-type contact layer) is removed together with $SiO_2$ by a lift-off method. Thus, the top surface of the ridge is exposed, and the side surfaces of the ridge are covered with $ZrO_2$.

(Ohmic Electrode)

Subsequently, a p-side ohmic electrode is formed on the top surface of the p-type contact layer and the first insulating film by sputtering. Ni/Au (100 Å/1500 Å) is employed as the p-side ohmic electrode. In addition, the n-side ohmic electrode is formed on the top surface of the n-type contact surface. The n-side ohmic electrode is composed of Ti/Al (200 Å/5500 Å), and is formed in a stripe shape in parallel to the ridge with a length similar to the ridge. After these electrodes are formed, thermal treatment is performed at 600° C. under a mixture atmosphere of oxygen and nitrogen.

(Second Insulating Film)

Subsequently, a resist is formed so as to cover on the whole surface of the p-side ohmic electrode on the ridge and a part of the upper surface of the n-side ohmic electrode. Then, a second insulating film of $SiO_2$ is formed on almost the whole surface. After the resist is lifted off, the second film with exposed portions of the whole top surface of the p-side ohmic electrode and the part of the n-side ohmic electrode is formed. The second insulating film may be formed so as to be spaced away from the p-side ohmic electrode. In addition, it may be formed so as to partially overlap the p-side ohmic electrode. Additionally, in consideration of a later dividing process, the first and second insulating films and the electrodes may not be formed in a strip-shaped region with a width of about 10 μm that centers a dividing line.

The second insulating film is provided so as to lie on the whole surface except for the upper surface of the p-side and n-side ohmic electrodes. The film is preferably formed of a material of an oxide containing at least one element selected from the group consisting of Si, Ti, V, Zr, Nb, Hf and Ta, or at least one material selected from the group consisting SiN, BN, SiC, AlN and AlGaN. Single layer film or multilayer film of $SiO_2$, $Al_2O_3$, $ZrO_2$ and $TiO_2$ can be given as a more preferable material among them.

(Pad Electrode)

Pad Electrodes are formed so as to cover the aforementioned ohmic electrodes. In this case, they are preferably formed so as to overlap the second insulating film. The p-side pad electrode has a lamination structure of Ni/Ti/Au (1000 Å/1000 Å/8000 Å) in this order. In addition, the n-side pad electrode is formed of Ni/Ti/Au (1000 Å/1000 Å/8000 Å) from the bottom side in this order. These pad electrodes are in contact with the p-side and n-side ohmic electrodes along stripe shapes so as to interpose the second insulating film between each pad electrode and each ohmic electrode.

(Cleavage and Resonance Surface Formation)

Subsequently, after the substrate is grinded to have a thickness of about 100 μm, a scribe groove is formed on the substrate back surface. The wafer is cleaved into bar-shaped laser devices by breaking it from the nitride semiconductor side. The cleavage surface of the nitride semiconductor layer is the ($1\bar{1}00$) M-plane of nitride semiconductor. This surface serves as a resonance surface.

(End Surface Protective Film Formation)

Figure 2:
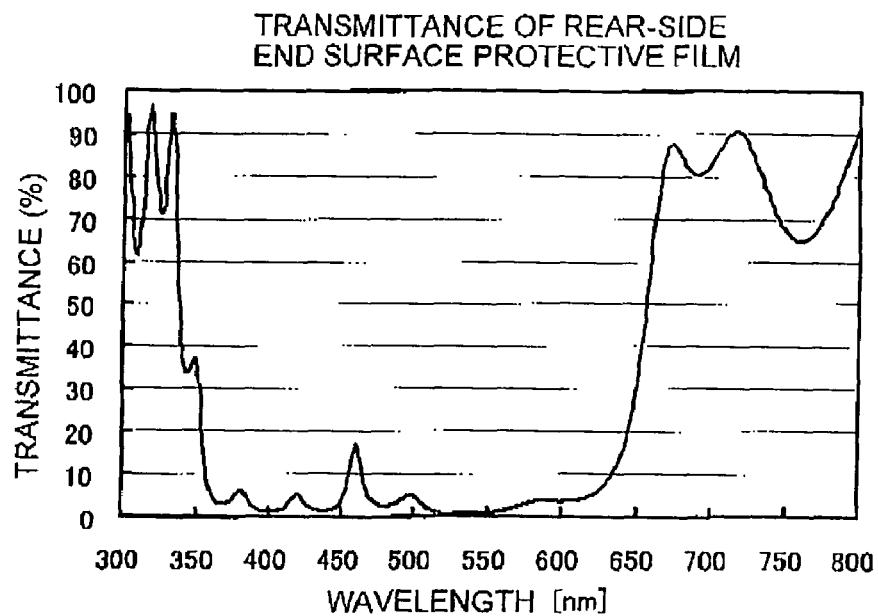
FIG. 2 is a graph showing the transmittance of an end surface protective film according to an embodiment of the present invention.
Figure 3:
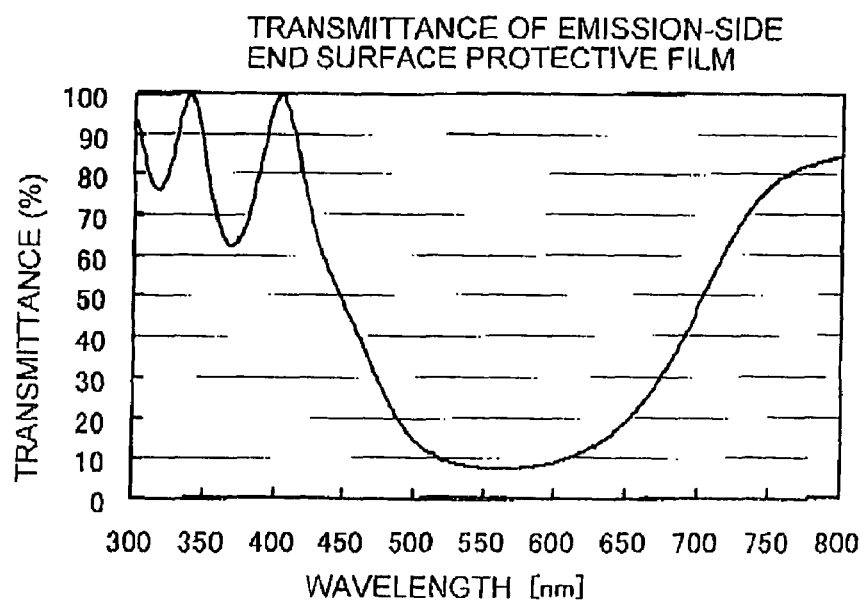
FIG. 3 is a graph showing the transmittance of an end surface protective film according to the embodiment of the present invention.
Figure 4:
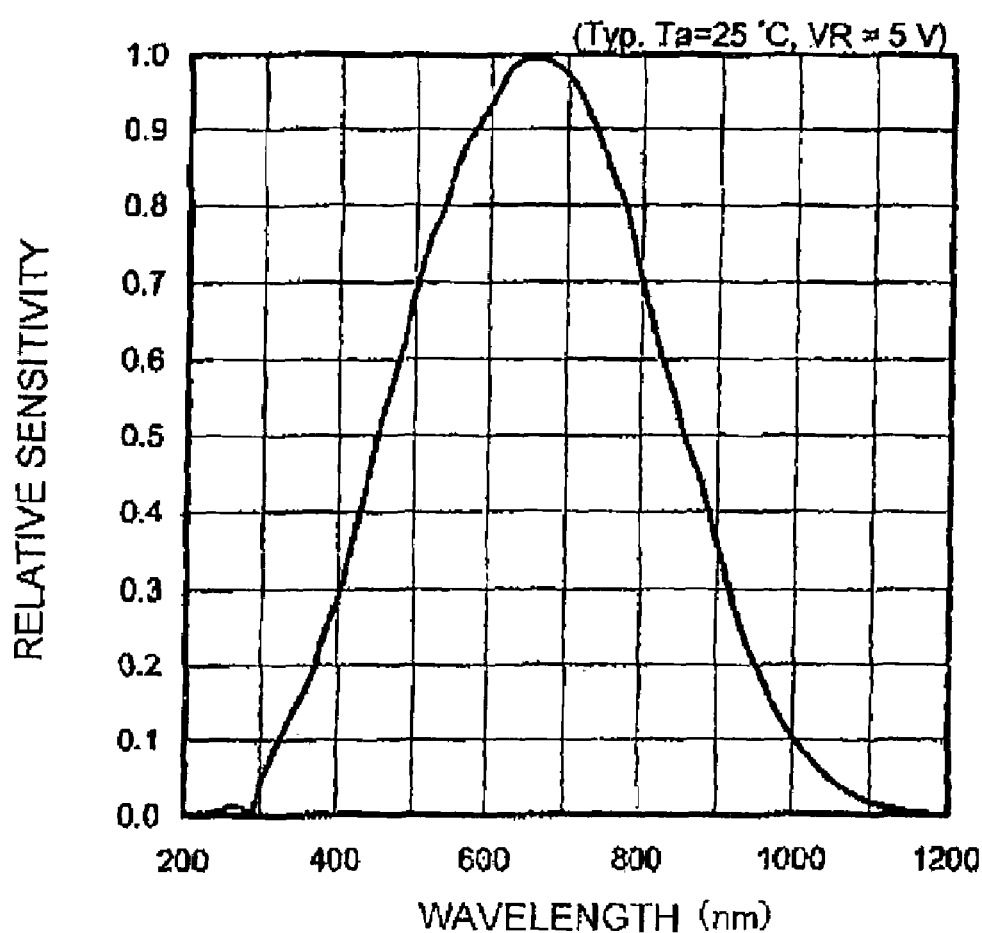
FIG. 4 is a spectral sensitivity curve of a photodiode.

The resonance surface formed as described above is provided with an end surface protective film by means of a sputtering device such as ECR sputtering device. A third end surface protective film composed of two pairs of ($SiO_2$ (917 Å)/$Nb_2O_5$ (550 Å)) is provided on an emission side end surface. A second end surface protective film composed of $ZrO_2$ (440 Å)+six pairs of ($SiO_2$ (667 Å)/$ZrO_2$ (440 Å)) is provided on a rear side end surface. In addition, a first end surface protective film composed of $ZrO_2$ (440 Å)+six pairs of ($SiO_2$ (917 Å)/$ZrO_2$ (605 Å)) is provided thereon. In the case where the wavelength of light emitted from the active layer is 400 nm, and the wavelength of luminescent radiation that is emitted by absorption of the wavelength of the light emitted from the active layer is 550 nm, as for the wavelengths (λ), these thicknesses are set to λ/4n (where n is the refractive index). The transmittance of the end surface protective films that are set as described above is shown in graphs. FIG. 3 shows the transmittance on the emission side. FIG. 2 shows the transmittance on the rear side. In both the cases of the emission side and the rear side, the transmittance in the wavelength range of the luminescent radiation is low. Thus, the luminescent radiation is less prone to outgo.

Finally, a groove is formed so as to be in substantially parallel to the ridge stripe by scribing, and bars are cut at the groove, thus, a semiconductor laser device according to the present invention is obtained. The scribing can be performed by mechanical or physical scribing with a blade of a cutter, and so on, or by optical or thermal scribing with YAG laser. In addition, the scribing can be performed from the semiconductor layer side or the substrate side. Various methods can be suitably selected depending on the shapes of device, the types of substrate, and so on.

The nitride semiconductor laser device obtained as described above has a luminescent radiation region in almost the whole plane of the nitride semiconductor substrate. The reason is that it is grown such that the dislocation density difference is not large too much. Therefore, there is not a local region that has a high luminescent radiation intensity. The laser device can be driven into continuous wave with wavelength of 405 nm and high power of 60 mW, at a room temperature and a threshold current density of 2.5 kA/cm$^2$. Since irradiation of the luminescent radiation on a detector provided on the rear side is suppressed, precise controlled driving can be provided. Additionally, the laser light emitted from the emission side end surface has less noise (unevenness), and has excellent FFP.

EXAMPLE 2

In an example 2, a third end surface protective film composed of $Al_2O_3$ (1800 Å)/three pairs of ($SiO_2$ (917 Å)/$Nb_2O_5$ (550 Å)) is provided on an emission side end surface. A second end surface protective film composed of $ZrO_2$ (440 Å)+six pairs of ($SiO_2$ (667 Å)/$TiO_2$ (370 Å)) is provided on a rear side end surface. In addition, a first end surface protective film composed of $ZrO_2$ (440 Å)+six pairs of ($SiO_2$ (917 Å)/$TiO_2$ (509 Å)) is provided thereon. Similarly to the example 1, in the case where the wavelength of light emitted from the active layer 104 is 400 nm, and the wavelength of luminescent radiation that is emitted by absorption of the wavelength of the light emitted from the active layer is 550 nm, as for the wavelengths (λ), these thicknesses are set to λ/4n (where n is the refractive index). In addition, an n-electrode 107 is provided on the back surface of the nitride semiconductor substrate. V/Pt/Au (150 Å/2000 Å/3300 Å) is provided as the material of the n-electrode. After the n-electrode is provided, thermal treatment is not performed. Other processes except for the processes described above are performed similarly to the example 1, thus, a nitride semiconductor laser device according to the present invention is obtained. The nitride semiconductor laser device obtained as described above has a luminescent radiation region almost over the whole region of the substrate similarly to the example 1, and emits low luminescent radiation. Additionally, the laser device can be driven into continuous wave with wavelength of 405 nm and high power of 60 mW, at a room temperature and a threshold current density of 2.5 kA/cm$^2$. Since irradiation of the luminescent radiation on a detector provided on the rear side, precise controlled driving can be provided. Additionally, the laser light emitted from the emission side end surface has less noise (unevenness), and has excellent FFP.

EXAMPLE 3

In an example 3, a substrate that is obtained as follows is used as a nitride semiconductor substrate. A GaAs substrate is used as a growth substrate. A stripe-shaped protective layer of SiO2 is formed in perpendicular to the M-plane of a nitride semiconductor on the upper surface of the substrate. A nitride semiconductor is grown by using this as a seed crystal such that the facet surface appears. Thus, a nitride semiconductor substrate 101 with thickness of 300 μm is obtained. The nitride semiconductor substrate obtained as described above is a nitride semiconductor substrate has a stripe-shaped low dislocation density region and a dislocation flux region. A ridge is formed in the upper part of the low dislocation density region 112. The low dislocation density 112 region is a luminescent radiation region. It absorbs light emitted from the active layer (405 nm) when a current is applied, and emits luminescent radiation (560 nm). In the example 3, although the n-electrode 107 is formed on the back surface of the nitride semiconductor substrate, before the ridge formation, etching is performed so as to expose the n-type semiconductor layer 102. Particularly, the n-type semiconductor layer 102 to the p-type semiconductor layer 103 that are formed above the dislocation flux 111 with poor crystallinity has a growth condition different from its periphery. Accordingly, its thickness is small as compared with the periphery. It is considered that such a region does not have sufficient pn junction formation. For this reason, the n-type semiconductor layer to the p-type semiconductor layer in the region that has a width slightly wider than the strip-shaped dislocation flux is removed by etching, thus, it is possible to reduce deterioration of the device performance. Except for a process where a third end surface protective film composed of two pairs (Al2O3 (823 Å)/TiO2 (509 Å)) is provided on the emission-side end surface, processes are performed similarly to the example 1, thus, a nitride semiconductor laser device according to the present invention is obtained. In addition, in the example 3, similarly to the example 1, in the case where the wavelength of light emitted from the active layer is 400 nm, and the wavelength of luminescent radiation that is emitted by absorption of the wavelength of the light emitted from the active layer is 550 nm, as for the wavelengths (λ), these thicknesses in the third end surface protective film are set to λ/4n (where n is the refractive index). The laser device obtained as described above can be driven into continuous wave with wavelength of 405 nm and high power of 60 mW, at a room temperature and a threshold current density of 2.5 kA/cm2. Since irradiation of the luminescent radiation on a detector provided on the rear side, precise controlled driving can be provided. Additionally, the laser light emitted from the emission side end surface has less noise (unevenness), and has excellent FFP.

The present invention can be applied to any devices to which laser devices can be applied such as CD player, MD player, various game machine devices, a DVD player, trunk line and the optical fiber communications systems for telephone line, submarine cable, etc., medical equipment including laser scalpel, laser therapy equipment and laser acupressure device, laser beam printer, printing device for display, etc., various measuring instruments, optical sensing device including laser level, laser measuring machine, laser speed gun laser thermometer, etc., and to various fields such as laser power carrying.

What is claimed is:
1. A nitride semiconductor laser device comprising:
   a nitride semiconductor substrate;
   a nitride semiconductor layer that has an n-type semiconductor layer, an active layer and a p-type semiconductor layer laminated on or above the nitride semiconductor substrate, and has a stripe-shaped waveguide region for laser light; and an emission-side end surface protective film and a rear-side end surface protective film opposed thereto on the end surfaces of resonance sandwiching the waveguide region, wherein the nitride semiconductor substrate has a luminescent radiation region that absorbs light emitted from the active layer and emits luminescent radiation with a wavelength longer than the wavelength of the emitted light, and the rear-side end surface protective film includes a first end surface protective film having a higher reflectivity for the wavelength of the luminescent radiation, and a second end surface protective film having a higher reflectivity for the wavelength of the emitted light from the active layer, the emission-side end surface protective film includes a third end surface protective film having a higher reflectivity for the wavelength of the luminescent radiation and having a lower reflectivity for the wavelength of the emitted light from the active layer, the emission-side end surface protective film covers the stripe-shaped waveguide region or an emission-side of the end surface of the resonance, the end surface protective films further cover both end surfaces of the nitride semiconductor substrate, and wherein the second end surface protective film is sandwiched by the nitride semiconductor layer and the first end surface protective film.

2. A nitride semiconductor laser device comprising:

a nitride semiconductor substrate;

a nitride semiconductor layer that has an n-type semiconductor layer, an active layer and a p-type semiconductor layer laminated on or above the nitride semiconductor substrate, and has a stripe-shaped waveguide region for laser light; and an emission-side end surface protective film and a rear-side end surface protective film opposed thereto on the end surfaces of resonance sandwiching the waveguide region, wherein the nitride semiconductor substrate has a luminescent radiation region that absorbs light emitted from the active layer and emits luminescent radiation with a wavelength longer than the wavelength of the emitted light, the rear-side end surface protective film includes a first end surface protective film having a higher reflectivity for the wavelength of the luminescent radiation, and a second end surface protective film having a higher reflectivity for the wavelength of the emitted light from the active layer, the emission-side end surface protective film includes a third end surface protective film having a higher reflectivity for the wavelength of the luminescent radiation, the first end surface protective film and/or the third end surface protective film has a lower reflectivity for the wavelength of the emitted light from the active layer, the emission-side end surface protective film covers the stripe-shaped waveguide region or an emission-side end surface of resonance the end surface protective films further cover both end surfaces of the nitride semiconductor substrate, and wherein the second end surface protective film is sandwiched by the nitride semiconductor layer and the first end surface protective film.

3. The nitride semiconductor laser device according to claim 1, wherein the emission-side end surface protective film includes a fourth end surface protective film having a higher reflectivity for the wavelength of the emitted light from the active layer (104).

4. The nitride semiconductor laser device according to claim 3, wherein each of the first, second, third and fourth end surface protective films has a single-layer or multilayer structure.

5. A nitride semiconductor laser device comprising:

a nitride semiconductor substrate;

a nitride semiconductor layer that has an n-type semiconductor layer, an active layer and a p-type semiconductor layer laminated on or above the nitride semiconductor substrate, and has a stripe-shaped waveguide region for laser light; and an emission-side end surface protective film and a rear-side end surface protective film opposed thereto on the end surfaces of resonance sandwiching the waveguide region, wherein the nitride semiconductor substrate has a luminescent radiation region that absorbs light emitted from the active layer and emits luminescent radiation with a wavelength longer than the wavelength of the emitted light, the rear-side end surface protective film includes a first end surface protective film having a higher reflectivity for the wavelength of the luminescent radiation, and a second end surface protective film having a higher reflectivity for the wavelength of the emitted light from the active layer, the emission-side end surface protective film includes a third end surface protective film having a higher reflectivity for the wavelength of the luminescent radiation, the first and second end surface protective films are laminated so as to at least partially overlap each other, the emission-side end surface protective film covers the stripe-shaped waveguide region or an emission-side end surface of resonance, the end surface protective films further cover both end surfaces of the nitride semiconductor substrate, and wherein the second end surface protective film is sandwiched by the nitride semiconductor layer and the first end surface protective film.

6. The nitride semiconductor laser device according to claim 4, wherein the third and fourth end surface protective films are laminated so as to at least partially overlap each other.

7. The nitride semiconductor laser device according to claim 1, wherein the second end surface protective film is formed in contact with the nitride semiconductor layer.

8. The nitride semiconductor laser device according to claim 3, wherein the fourth end surface protective film is formed in contact with the nitride semiconductor layer.

9. The nitride semiconductor laser device comprising:

a nitride semiconductor substrate;

a nitride semiconductor layer that has an n-type semiconductor layer, an active layer and a p-type semiconductor layer laminated on or above the nitride semiconductor substrate, and has a stripe-shaped waveguide region for laser light; and end surface protective films on both end surfaces of resonance sandwiching the waveguide region, wherein the nitride semiconductor substrate has a luminescent radiation region that absorbs light emitted from the active layer and emits luminescent radiation with a wavelength longer than the wavelength of the emitted light, at least one of the end surface protective films has a higher reflectivity for the wavelength of the luminescent radiation from the luminescent radiation region, the luminescent radiation region has a lower dislocation density as compared with the periphery thereof, at least one of the end surface protective film covers the stripe-shaped waveguide region or an emission-side end surface of resonance~ the end surface protective films further cover both end surfaces of the nitride semiconductor substrate, and wherein the second end surface protective film is sandwiched by the nitride semiconductor lager and the first end surface protective film.

10. A nitride semiconductor laser device comprising:
a nitride semiconductor substrate;
a nitride semiconductor layer that has an n-type semiconductor layer, an active layer and a p-type semiconductor layer laminated on or above the nitride semiconductor substrate, and has a stripe-shaped waveguide region for laser light; and
end surface protective films on both end surfaces of resonance sandwiching the waveguide region, wherein
the nitride semiconductor substrate has a luminescent radiation region that absorbs light emitted from the active layer and emits luminescent radiation with a wavelength longer than the wavelength of the emitted light,
at least one of the end surface protective films has a higher reflectivity for the wavelength of the luminescent radiation from the luminescent radiation region, and
the luminescent radiation region has a high impurity concentration as compared with the periphery thereof,
at least one of the end surface protective film covers the stripe-shaped waveguide region or an emission-side end surface of resonance,
the end surface protective films further cover both end surfaces of the nitride semiconductor substrate, and wherein
the second end surface protective film is sandwiched by the nitride semiconductor laver and the first end surface protective film.

11. The nitride semiconductor laser device according to claim 10, wherein the impurity is at least one element selected from the group consisting of H, O, C and Si.

12. A nitride semiconductor laser device comprising:
a nitride semiconductor substrate;
a nitride semiconductor layer that has an n-type semiconductor layer, an active layer and a type semiconductor layer laminated on or above the nitride semiconductor substrate, and has a stripe-shaped waveguide region for laser light; and
end surface protective films on both end surfaces of resonance sandwiching the waveguide region, wherein
the nitride semiconductor substrate has a luminescent radiation region that absorbs light emitted from the active layer and emits luminescent radiation with a wavelength longer than the wavelength of the emitted light,
at least one of the end surface protective films has a higher reflectivity for the wavelength of the luminescent radiation from the luminescent radiation region,
the active layer has a light emission wavelength of 390 to 420 nm, and the luminescent radiation has a wavelength of 550 to 600 nm,
at least one of the end surface protective film covers the stripe-shaped waveguide region or an emission-side end surface of resonance:
the end surface protective films further cover both end surfaces of the nitride semiconductor substrate, and wherein
the second end surface protective film is sandwiched by the nitride semiconductor layer and the first end surface protective film.

13. The nitride semiconductor laser device according to claim 9, wherein the luminescent radiation region is formed in a stripe shape substantially parallel to the waveguide region.

14. The nitride semiconductor laser device according to claim 1, wherein the waveguide region is formed above the luminescent radiation region.

15. A nitride semiconductor laser device comprising:
a nitride semiconductor substrate);
a nitride semiconductor layer that has an n-type semiconductor layer, an active layer and a p-type semiconductor layer laminated on or above the nitride semiconductor substrate, and has a stripe-shaped waveguide region for laser light; and
end surface protective films on both end surfaces of resonance sandwiching the waveguide region, wherein
the nitride semiconductor substrate has a luminescent radiation region that absorbs light emitted from the active layer and emits luminescent radiation with a wavelength longer than the wavelength of the emitted light,
at least one of the end surface protective films has a higher reflectivity for the wavelength of the luminescent radiation from the luminescent radiation region, and
the waveguide region is formed in a region that is spaced away from the luminescent radiation region,
at least one of the end surface protective film covers the stripe-shaped waveguide region or an emission-side end surface of resonance,
the end surface protective films further cover both end surfaces of the nitride semiconductor substrate, and wherein
the second end surface protective film is sandwiched by the nitride semiconductor layer and the first end surface protective film.

16. A laser apparatus comprising the nitride semiconductor laser device according to claim 9, and a detector that detect the light emission of the nitride semiconductor laser device, wherein the detector has a spectral sensitivity in a wavelength )~ex of the luminescent radiation higher than a wavelength) $\lambda_{LD}$ of the emitted light of the nitride semiconductor laser device.

17. A laser apparatus comprising the nitride semiconductor laser device according to claim 1, and a detector that detect the light emission of the nitride semiconductor laser device, wherein the detector has a spectral sensitivity in a wavelength $\lambda_{ex}$ of the luminescent radiation higher than a wavelength $\lambda_{LD}$ of the emitted light of the nitride semiconductor laser device.

* * * * *